United States Patent [19]

Hirano et al.

[11] Patent Number: 5,227,336
[45] Date of Patent: Jul. 13, 1993

[54] TUNGSTEN CHEMICAL VAPOR DEPOSITION METHOD

[75] Inventors: Kiichi Hirano; Nobuo Takeda, both of Sendai, Japan

[73] Assignee: Small Power Communication Systems Research Laboratories Co., Ltd., Sendai, Japan

[21] Appl. No.: 813,831

[22] Filed: Dec. 27, 1991

[51] Int. Cl.$^5$ ............................................. H01L 21/44
[52] U.S. Cl. ........................................ 437/192; 437/7; 437/8; 437/187; 437/926
[58] Field of Search ................ 437/192, 7, 8, 187, 437/926

[56] References Cited

U.S. PATENT DOCUMENTS

| | | | |
|---|---|---|---|
| 4,751,101 | 6/1988 | Joshi | 437/187 |
| 4,823,291 | 4/1989 | Berman | |
| 4,913,790 | 4/1990 | Narita et al. | 156/643 |
| 5,071,789 | 12/1991 | Nakata | 437/192 |
| 5,128,278 | 7/1992 | Harada et al. | 437/192 |

FOREIGN PATENT DOCUMENTS 0252667 1/1988 European Pat. Off.
0181419 7/1989 Japan.

OTHER PUBLICATIONS

The IEEE Electron Devices Society, 1988 Symposium on VLSI Technology, May 10, 1988, pp. 97-98, A. Nishiyama, et al., "Two Step Tungsten Selective CVD for High Speed CMOS Device Applications".
Solid State Technology, vol. 28, No. 12, Dec. 1985, pp. 51-59, Eliot K. Broadbent, et al., "Selective Tungsten Processing by Low Pressure CVD".
Journal of the Electrochemical Society, vol. 138, No. 3, Mar. 1991, pp. 783-788, J. Holleman, et al., "A Reflectometric Study of the Reaction Between Si and WF6 During W-LPCVD on Si and of the Renucleation During the H₂ Reduction of WF₆"..
Wolf; "Silicon Processing for the VLSI Era"; vol. 2; pp. 245-247; 1990.

Primary Examiner—Brian E. Hearn
Assistant Examiner—Trung Dang
Attorney, Agent, or Firm—Oblon, Spivak, McClelland, Maier & Neustadt

[57] ABSTRACT

A tungsten film is formed in two steps in a tungsten chemical vapor deposition method of the present invention. In a first step, a first thin tungsten film is selectively grown on a surface of a silicon substrate by a silicon reduction using a WF$_6$ gas as a tungsten source, followed by a second step in which another tungsten film is formed on the first tungsten film by a silane reduction using a WF$_6$ gas as a tungsten source. The state of the silicon substrate surface is monitored by a pyrometer, and the timing of change from the silicon reduction to the silane reduction is determined on the basis of the intensity of the infrared ray radiation.

2 Claims, 2 Drawing Sheets

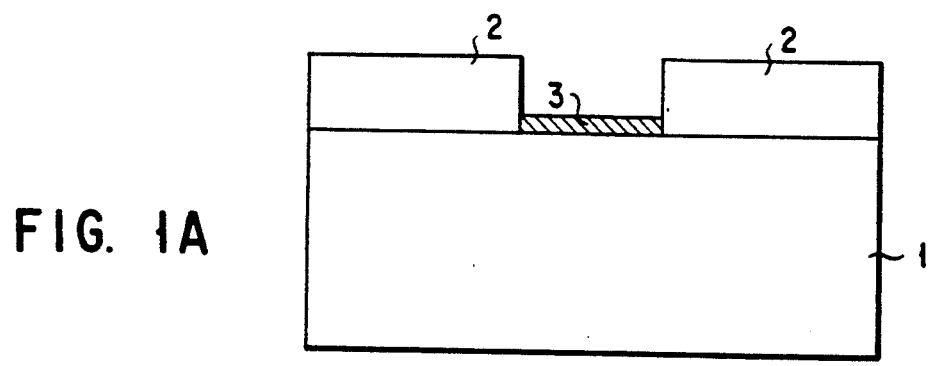
FIG. 1A
FIG. 1B
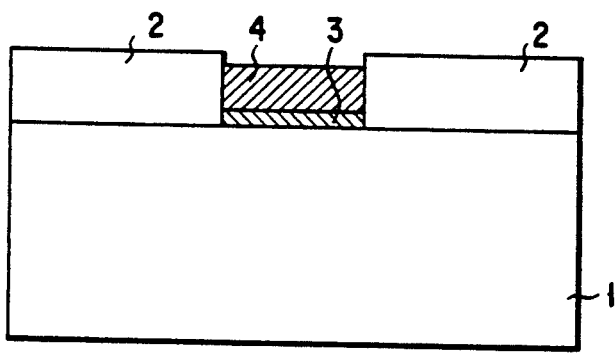
FIG. 2

TUNGSTEN CHEMICAL VAPOR DEPOSITION METHOD

BACKGROUND OF THE INVENTION

1. Field of the Invention

The present invention relates to a tungsten Chemical Vapor Deposition method.

2. Description of the Related Art

In the tungsten Chemical Vapor Deposition (CVD) method, the reduction of $WF_6$ using hydrogen, silicon and silane is generally used. The $H_2$ reduction of $WF_6$ permits forming a tungsten film of a satisfactory quality with a sufficiently high growth rate. However, a large amount of by-product, hydrogen fluoride, is produced in the reaction. As a result, a silicon oxide film tends to be etched, making the $H_2$ reduction of $WF_6$ unsuitable for the fabrication of transistor. In addition, the surface-bonding strength between the tungsten film and the silicon substrate tends to be insufficient depending on the CVD conditions.

The Si reduction of $WF_6$ permits improving the surface-bonding strength between the tungsten film and the substrate, compared with the $H_2$ reduction of $WF_6$. However, the growth rate of the tungsten film is low in the case of the Si reduction of $WF_6$. Also, the maximum thickness of the tungsten film formed is determined by the self-limiting nature of the reaction. It follows that it is difficult to obtain a tungsten film of a desired thickness. What should also be noted is that, in the Si reduction of $WF_6$ a tungsten film is grown while consuming Si. In other words, the surface region of the silicon substrate tends to be encroached. It follows that it is not desirable to employ the Si reduction of $WF_6$ in the case of a shallow junction or a thin device region. Under the circumstances, any of the $H_2$ reduction of $WF_6$ and the Si reduction of $WF_6$ is not practically employed in general.

The $SiH_4$ reduction of $WF_6$ is widely employed nowadays. However, the $SiH_4$ reduction of $WF_6$ is also defective in that it is difficult to obtain a sufficiently enough surface-bonding strength between the tungsten film formed and the substrate depending on the surface conditions. To overcome the difficulty, a pretreatment is applied under the same reaction chamber, using, for example, $SF_6$ so as to slightly etch the surface region of the silicon substrate, before the deposition.

In other case, it is possible to form W silicide at the interface region between a silicon substrate and a tungsten film. However, it is difficult to find good conditions of silicide formation. In addition, the reproducibility in, for example, the thickness of the film is unsatisfactory.

SUMMARY OF THE INVENTION

An object of the present invention is to provide a tungsten CVD method which permits growing a tungsten film of a high quality and enough surface-bonding strength without bringing about defects within the substrate.

In the method of the present invention, a thin film is selectively grown on the surface of a silicon substrate by the reduction of $WF_6$ using Si, followed by selectively growing a thin film by the reduction of $WF_6$ using $SiH_4$. During the growth of these films, the conditions of the substrate surface are monitored by a pyrometer. Also, the opportunity to change from the Si reduction to the $SiH_4$ reduction of $WF_6$ is determined by the intensity of the infrared ray radiation. In short, the present invention employs a two-step growth utilizing the Si reduction and the $SiH_4$ reduction of $WF_6$, in which the surface condition of the thin films is monitored so as to form a satisfactory tungsten film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

Figs. 1A and 1B explain how to form a tungsten film by the tungsten CVD method according to one embodiment of the present invention;

FIG. 2 schematically shows the construction of an apparatus for forming the thin tungsten film shown in FIG. 1.

DETAILED DESCRIPTION OF THE PREFERRED EMBODIMENT

Figure 3:
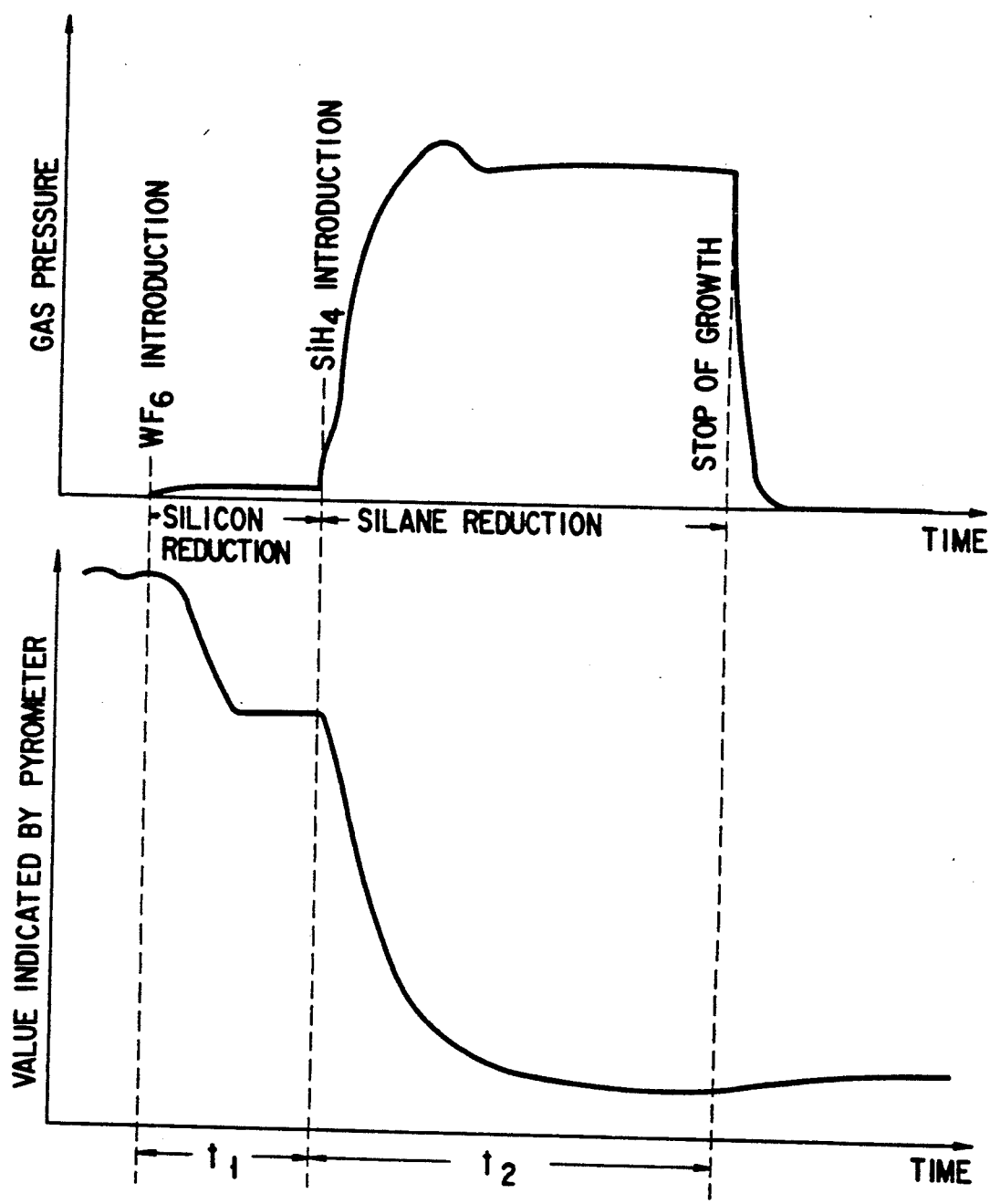
FIG. 3 exemplifies data of a thin film growth by the tungsten CVD method of the present invention.

FIGS. 1A and 1B collectively show a tungsten CVD method according to one embodiment of the present invention. In this embodiment, a tungsten layer is selectively grown in an opening a made in a silicon dioxide film 2 grown on a silicon substrate 1.

In a first step shown in FIG. 1A, the silicon dioxide film 2 is formed on the silicon substrate 1, followed by selectively etching the silicon oxide film 2 by techniques of, for example, photo-lithography so as to form the opening a. Then, a tungsten film 3 is grown within the opening a in a thickness of about 10 nm by a silicon reduction of $WF_6$ using Si supplied from the substrate 1. The maximum thickness of the tungsten film 3 formed within the opening a is limited by the growing temperature. In general, the growing temperature is set at 350° to 450° C. In this case, the maximum thickness noted above is about 20 nm.

The growth rate is affected by the surface condition of the silicon substrate 1. Thus, in order to ensure a high reproducibility, the surface of the silicon substrate is observed so as to confirm the growth of the tungsten film 3.

In a second step shown in FIG. 1B, a tungsten film 4 is formed on the tungsten film 3 formed in the first step by the reduction of $WF_6$ using $SiH_4$. In this case, $SiH_4$ is added to $WF_6$. The tungsten film 4 can be formed in a desired thickness. It is possible to use $H_2$ as a carrier gas in the second step. It should be noted that the tungsten film 3 formed in the first step has enough surface-bonding strength to the silicon substrate 1. On the other hand, the thickness and the sheet resistance of the tungsten film as a whole can be controlled as desired by the formation of the tungsten film 4 in the second step.

The apparatus for working the tungsten CVD method of the present invention is constructed as shown in, for example, FIG. 2. As shown in the drawing, the apparatus comprises a reaction chamber 5. A quartz glass tube or a stainless steel chamber provided with an inlet port can be used as the reaction chamber 5. The reaction chamber 5 is provided with a ga inlet port 6 for introducing the reactant gases into the chamber 5 and with an exhaust port 7. A heater 8 utilizing an electric heater or lamp heater controlled by controller 9 is disposed within the reaction chamber 5 to avoid the deposition inside the chamber. A sample 10, e.g., silicon substrate, is disposed on the heater 8. Under this condition, reactant gases such as $WF_6$ and $SiH_4$ are introduced into the reaction chamber 5 through the gas inlet port 6 so as to carry out a tungsten deposition on the sample 10. It should be noted that a pyrometer 11 is provided above the reaction chamber 5 so as to observe the surface condition of the sample 10.

FIG. 3 shows a relation of time versus the indication of the pyrometer 11 and the gas pressure within the reaction chamber 5 in the case of forming a tungsten thin film by the method of the present invention. It should be noted that the indication of the pyrometer 11 is the intensity of the infrared light having a wavelength of 2 to $5\mu m$. Because of the emissivity of infrared light from tungsten is lower than that of Si, with the result that the tungsten films 3 and 4 are grown on the surface of the silicon substrate 1 with decrease in the value indicated by the pyrometer 11, as shown in the graph of FIG. 3.

To be more specific, the growth temperature is determined by the heater 8 at the beginning of the CVD operation at a predetermined value for carrying out the growth of a tungsten film by the Si reduction of $WF_6$ in the first step. If a tungsten source of $WF_6$ is introduced into the reaction chamber, the gas pressure within the reaction chamber 5 is slightly increased. After a short time from the increase in the gas pressure, we call "Initial delay time" the value indicated by the pyrometer 11 begins to be decreased, denoting the growth of the tungsten film 3. FIG. 3 shows that the characteristic curves tend to be gradually saturated, indicating that the growth rate of the tungsten film 3 is decreased.

Time t1 after introduction of $WF_6$, $SiH_4$ is introduced through the gas inlet port 6 into the reaction chamber 5 so as to achieve growth of the tungsten film 4 by the $SiH_4$ reduction of $WF_6$ in the second step. As a result, the gas pressure within the reaction chamber 5 is rapidly increased, and the value indicated by the pyrometer 11 is rapidly decreased. This indicates the growth of the tungsten film 4. The deposition can be stopped time t2 after introduction of $SiH_4$ into the reaction chamber 5.

However, the initial delay time in the initiation of the first step is affected by the surface condition of the silicon substrate 1, it should be noted that it is not desirable to set unduly long growth time because silicon atoms in the surface region of substrate 1 are consumed. In order to overcome the difficulty, the pyrometer 11 used in the present invention is effective. Specifically, when the pyrometer 11 indicates a first saturation, it is determined in the present invention that the tungsten film 3 has grown to have a thickness large enough to ensure a sufficient surface-bonding strength with the silicon substrate. In other words, it is the chance to introduce $SiH_4$ into the reaction chamber 5 so as to change the CVD mechanism the $SiH_4$ reduction of $WF_6$.

As described above, the tungsten film 3 having enough thickness can be obtained without fail regardless of various initial delay time of the growth. It follows that, even if the tungsten film 4 is further grown in the second step, obtained tungsten film obtained has a high reproducibility. The particular method of the present invention makes it possible to obtain a tungsten film of a desired thickness having a high surface-bonding strength with the substrate and a low resistivity of 6.4 $\mu\Omega.cm$ by a selective deposition technique.

As described above in detail, the tungsten CVD method of the present invention makes it possible to obtain a thin tungsten film having a high surface-bonding strength with the substrate and a low resistivity. Since the tungsten film can be used for filling a contact hole or as a wiring, the technique of the present invention is of a high industrial value.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A tungsten chemical vapor deposition method, comprising:
    a first step of selectively growing a first thin tungsten film of a predetermined thickness in a desired region on the surface of a silicon substrate by reduction of a $WF_6$ gas introduced into an atmosphere of a predetermined temperature containing said silicon substrate; and
    a second step of selectively growing a second tungsten film of a predetermined thickness on said first thin tungsten film by reduction of said $WF_6$ with a silane gas further introduced into said atmosphere, wherein the surface state of said substrate is monitored by a pyrometer and the switching from said first step to said second step is performed when the emissivity of infrared light from the substrate surfaces reaches a predetermined value.

2. The tungsten CVD method according to claim 1, wherein the switching from said first step to said second step is performed when the output of said pyrometer indicates a first saturation state.

* * * * *